United States Patent
Sharma et al.

(10) Patent No.: US 11,762,038 B2
(45) Date of Patent: *Sep. 19, 2023

(54) SYSTEM AND METHOD FOR DETECTING STATOR FAULTS IN AC ELECTRICAL MACHINES

(71) Applicant: Eaton Intelligent Power Limited, Dublin (IE)

(72) Inventors: Santosh Kumar Sharma, Viman Nagar (IN); Abhilash Pani, Dhenkan (IN); Steven Andrew Dimino, Wauwatosa, WI (US); Mark Alan Verheyen, Whitefish Bay, WI (US)

(73) Assignee: Eaton Intelligent Power Limited, Dublin (IE)

( * ) Notice: Subject to any disclaimer, the term of this patent is extended or adjusted under 35 U.S.C. 154(b) by 1 day.

This patent is subject to a terminal disclaimer.

(21) Appl. No.: 17/484,262

(22) Filed: Sep. 24, 2021

(65) Prior Publication Data

US 2022/0075005 A1  Mar. 10, 2022

Related U.S. Application Data

(63) Continuation of application No. 15/380,724, filed on Dec. 15, 2016, now Pat. No. 11,221,377.

(51) Int. Cl.
    *G01R 31/52*     (2020.01)
    *G01R 31/34*     (2020.01)
    (Continued)

(52) U.S. Cl.
    CPC ............. *G01R 31/52* (2020.01); *G01R 31/34* (2013.01); *G01R 31/346* (2013.01); *G01R 31/42* (2013.01); *G01R 31/72* (2020.01)

(58) Field of Classification Search
CPC ...... G01R 31/34; G01R 31/346; G01R 31/42; G01R 31/52; G01R 31/72
See application file for complete search history.

(56) References Cited

U.S. PATENT DOCUMENTS

2009/0021878 A1\*    1/2009   Saha .................... G01R 31/088
                                                                                                                                          361/81
2010/0194324 A1     8/2010   Kasztenny et al.
(Continued)

FOREIGN PATENT DOCUMENTS

CH             703900 B1 \*   4/2012   ............... H02H 3/42
CN          2308192 Y      2/1999
(Continued)

OTHER PUBLICATIONS

Fernando Briz, Michael W. Degner, Pablo Garcia, Alberto B. Diez, "Induction Machine Diagnostics Using Zero Sequence Components," Fortieth IAS Annual Meeting, Conference Record of the 2005 Industry Applications, Conference, 2005 (vol. 1, pp. 34-41) (2005).

(Continued)

*Primary Examiner* — Yoshihisa Ishizuka
(74) *Attorney, Agent, or Firm* — DiBerardino McGovern IP Group LLC

(57) ABSTRACT

A system and method for detecting a phase-to-ground fault in an AC electrical machine operates to receive measurements of three-phase voltages and currents provided to the AC electrical machine, compute at least one of a zero sequence component and a negative sequence component of voltage and current from the three-phase voltages and currents, and calculate a fault severity index (FSI) based on the zero or negative sequence component of voltage and current, so as to identify a phase-to-ground fault in the AC electrical machine. Calculating the FSI further includes determining a total value of the zero or negative sequence current, deter- (Continued)

mining a noise-contributed value of the zero or negative sequence current included in the total value, determining a compensated value of the zero or negative sequence current based on the total value and the noise-contributed value, and calculating the FSI based on the compensated value.

20 Claims, 5 Drawing Sheets

(51) Int. Cl.
*G01R 31/72* (2020.01)
*G01R 31/42* (2006.01)

(56) References Cited

U.S. PATENT DOCUMENTS

| | | | |
|---|---|---|---|
| 2011/0089883 | A1 | 4/2011 | Anwar et al. |
| 2015/0276827 | A1* | 10/2015 | Sharma ............ H02H 3/253 |
| | | | 702/60 |
| 2015/0276880 | A1 | 10/2015 | Sharma et al. |

FOREIGN PATENT DOCUMENTS

| | | | |
|---|---|---|---|
| CN | 1414676 | A | 4/2003 |
| CN | 1560976 | A | 1/2005 |
| CN | 101453187 | A | 6/2009 |
| CN | 102707232 | A | 10/2012 |
| CN | 103364665 | A | 10/2013 |
| CN | 106133535 | A | 11/2016 |
| CN | 106133538 | A | 11/2016 |
| JP | 2004327348 | A | 11/2004 |
| KR | 100925148 | B1 | 11/2004 |
| KR | 20120091141 | A | 8/2012 |
| WO | 2012010193 | A1 | 1/2012 |
| WO | 2013026276 | A1 | 2/2013 |

OTHER PUBLICATIONS

D. Jasim, M. Sumner, C. Gerada, J-Arellano-Padilla, "Fault Ride Through Control for a Delta Connected Induction Motor with an Open Winding Fault by Controlling the Zero Sequence Voltage," 5th IET International Conference on Power Electronics, Machines and Drives (PEMD 2010) (pp. 1-6) (2010).
Ompusunggu et al., "Winding Fault Diagnosis of a 3-Phase Induction Motor Powered by Frequency-Inverter Drive Using the Current and Voltage Signals," Proceedings of the 14th Mechatronics Forum International Conference, Mechatronics 2014, Jun. 30, 2014, pp. 1-8.
Office Action, counterpart Chinese Patent Application No. 201780077020.0, dated Mar. 17, 2021, 18 pages total (including English translation of 11 pages).
Yeonkyung Kim, Korean International Searching Authority, International Search Report and Written Opinion, counterpart PCT Application No. PCT/US2017/064399, dated Mar. 20, 2018, 8 pages total.

* cited by examiner

SYSTEM AND METHOD FOR DETECTING STATOR FAULTS IN AC ELECTRICAL MACHINES

CROSS-REFERENCE TO RELATED APPLICATION

This application is a continuation of U.S. patent application Ser. No. 15/380,724, filed Dec. 15, 2016 and titled SYSTEM AND METHOD FOR DETECTING STATOR FAULTS IN AC ELECTRICAL MACHINES, which is incorporated herein by reference in its entirety.

BACKGROUND OF THE INVENTION

The present invention relates generally to three-phase alternating current (AC) electrical machines or motors and, more particularly, to a system and method for detecting stator faults in such electrical machines.

In industrial facilities, electrical machines such as generators, AC motors, and/or transformers are used in various applications. As one example, induction motors are used for applications like pumping, cooling, material movement, and other applications where cost-efficient and robust motors are required. When these motors fail, the processes in/with which they are employed suffer downtime, which leads to costs associated with such downtime being incurred.

It is recognized that various factors can lead to failure of an electrical machine, including failures in the bearings, stator, and/or rotor of the machine—with faults related to the stator attributing to 36% of all failures. Of these stator faults/failures, 76% of these faults/failures are considered stator winding faults, which generally refers to failures of the winding insulation that lead to inter-turn faults and phase-ground faults. With respect to the stator winding faults in the system, these faults may be caused by the gradual deterioration of winding insulation due to a combination of electromechanical-force-induced vibration, high dv/dt voltage surges, thermal overload, and/or contamination. If a stator winding fault occurs and the windings of the stator are shorted, a large circulating fault current is induced in the shorted turn, leading to localized thermal overloading. This localized thermal overloading can eventually result in motor breakdown due to ground-fault/phase-to-phase-insulation or open-circuit failure within a short period of time, if left undetected.

Traditionally, phase-ground faults due to stator winding failures are detected by measuring the currents flowing into the earth using a current transformer (CT) or by using the three-phase currents. However, various factors like system leakage currents, high-resistance grounding, supply harmonics, and/or unbalance in the CTs make it difficult to achieve very reliable detection of ground faults under varying system conditions and for various motor sizes. Additionally, the cost associated with the use of a dedicated CT for detecting ground faults may be prohibitive.

It would therefore be desirable to provide a system and method that is capable of detecting phase-ground faults in electrical machines for purposes of diagnosing stator faults. It would also be desirable for such a system and method to detect phase-ground faults without the use of a dedicated ground fault CT and in a manner that eliminates the effects of system leakage currents, high-resistance grounding, and/or supply harmonics, that might make it difficult to achieve reliable detection of a ground fault.

BRIEF DESCRIPTION OF THE INVENTION

In accordance with one aspect of the present invention, a controller configured to detect a phase-to-ground fault in an AC electrical machine is provided. The controller comprises a processor programmed to receive measurements of three-phase voltages and currents provided to the AC electrical machine, the measurements being received from voltage and current sensors associated with the electrical distribution circuit. The processor is also programmed to compute at least one of a zero sequence component and a negative sequence component of voltage and current from the three-phase voltages and currents and calculate a fault severity index (FSI) based on the at least one of the zero sequence component and the negative sequence component of voltage and current, so as to identify a phase-to-ground fault in the AC electrical machine, wherein calculating the FSI further includes determining a total value of at least one of a zero sequence current and a negative sequence current, determining a noise-contributed value of the at least one of the zero sequence current and the negative sequence current included in the total value, determining a compensated value of the at least one of the zero sequence current and the negative sequence current based on the total value and the noise-contributed value, and calculating the FSI based on the compensated value.

In accordance with another aspect of the invention, a method for identifying a phase-to-ground fault in an AC electrical machine includes measuring three-phase voltages and currents provided to the AC electrical machine by way of voltage and current sensors, the AC electrical machine comprising a plurality of stator windings. The method also includes causing a fault detector to identify a phase-to-ground fault in the AC electrical machine, wherein causing the fault detector to identify the phase-to-ground fault comprises receiving the measured three-phase voltages and currents provided to the AC electrical machine, determining one or more of a zero sequence current and a negative sequence current from the three-phase currents, performing a noise-based compensation of the one or more of the zero sequence current and the negative sequence current to produce one or more of a residual zero sequence current and residual negative sequence current representative of a phase-to-ground current, and identifying a phase-to-ground fault in the AC electrical machine based on the one or more of the residual zero sequence current and the residual negative sequence current.

In accordance with yet another aspect of the invention, a fault detector for detecting a phase-to-ground fault in an AC electrical machine is provided. The fault detector comprises a processor programmed to receive an input comprising three-phase voltages and currents provided to the AC electrical machine, determine one or more of a zero sequence current and a negative sequence current from the three-phase currents, perform a noise-based compensation of the one or more of the zero sequence current and the negative sequence current to produce one or more of a residual zero sequence current and residual negative sequence current representative of a phase-to-ground current, and identify a phase-to-ground fault in the AC electrical machine based on the one or more of the residual zero sequence current and the residual negative sequence current.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention are directed to a system and method for detecting stator faults in three-phase AC electrical machines via the detection of phase-to-ground currents. In detecting phase-to-ground faults, the system and method function to compensate for noise-based factors to improve the detection accuracy of phase-to-ground faults.

Figure 1:
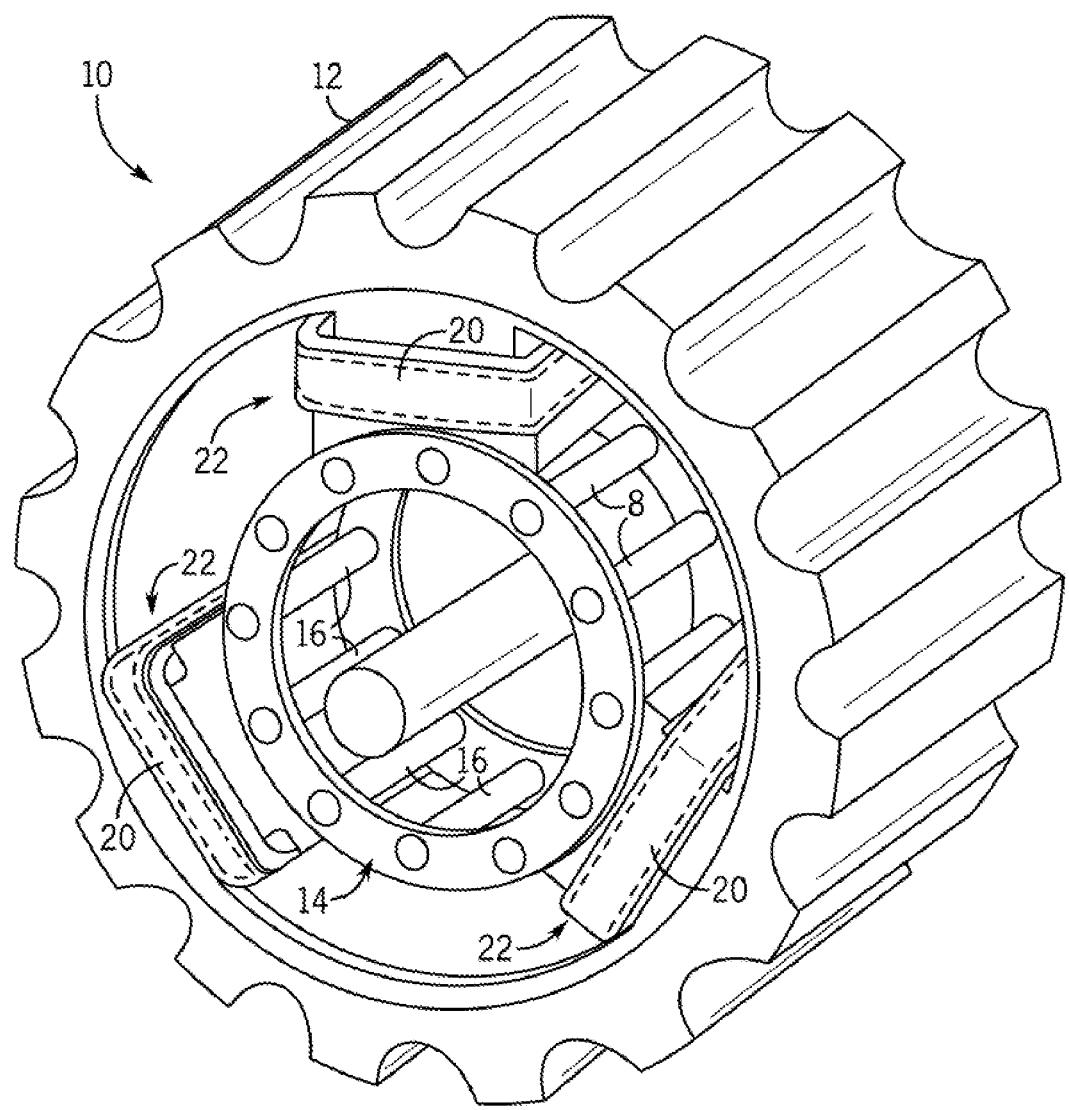
FIG. 1 is a simplified illustration of an AC induction machine useable with embodiments of the present invention.

Referring to FIG. 1, a perspective view of an AC electrical machine 10 is provided in/with which embodiments of the invention may be employed in order to detect stator faults therein. The electrical machine 10 may take the form of any of a number of known AC electrical machines, such as being in the form of an induction motor, a generator, or a transformer, for example, or any other load that might be driven by a three-phase power and useful in an industrial setting. For purposes of illustration, the AC electrical machine 10 shown in FIG. 1 is an induction machine that may be a motor or generator, according to various embodiments of the invention. The induction machine 10 comprises a stator 12 and a rotor assembly 14—with the rotor assembly including a number of rotor bars 16 coupled to an end-ring 18 (i.e., a rotor cage). In operation, current flows through windings 20 of the stator 12 create a magnetic field that induces current flow through rotor bars 16 needed to produce torque, with the current through the rotor bars 16 being provided via electromagnetic induction from the magnetic field of the stator windings 20. To prevent electrical shorts between the windings 20 of the stator 12, winding insulation 22 is provided about the stator windings 20.

With respect to the AC induction machine 10, it is recognized that failures of the winding insulation 22—such as may be caused by gradual deterioration of the winding insulation due to a combination of electromechanical-force-induced vibration, high dv/dt voltage surges, thermal overload, and/or contamination, for example—may lead to inter-turn faults and phase-ground faults in the electrical machine 10. Embodiments of the invention are directed to a system and method for identifying stator faults in an AC electrical machine 10 via the detection of phase-to-ground faults therein without the use of a dedicated phase-ground fault current detector, such as a current transformer. In detecting such phase-ground faults, the system and method compensate for noise-based factors, so as to improve the detection accuracy of the phase-to-ground faults.

Figure 2:
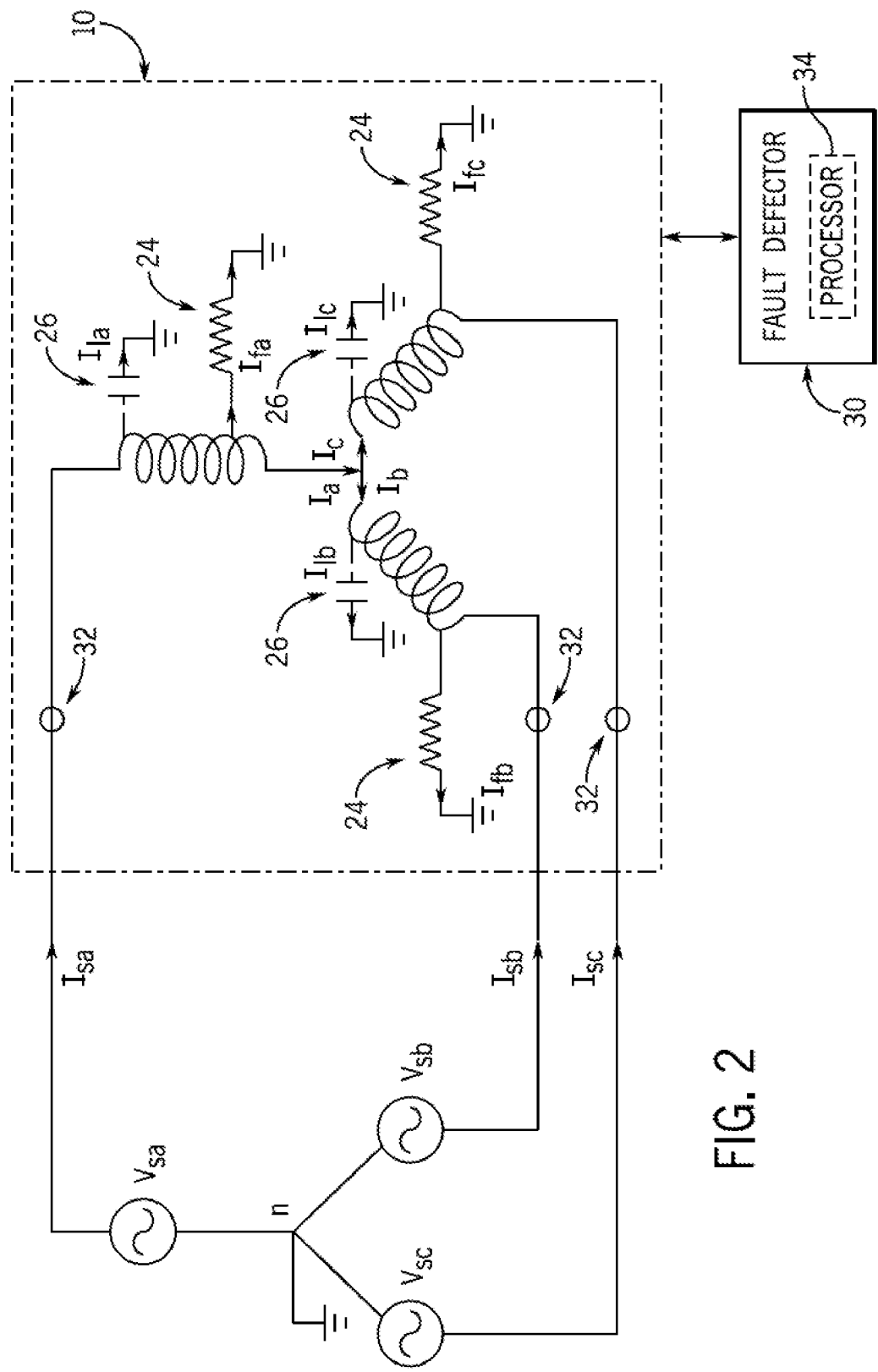
FIG. 2 is a schematic diagram of a star connected AC electrical machine and associated fault detector for detecting phase-to-ground faults therein, according to an embodiment of the invention.
Figure 3:
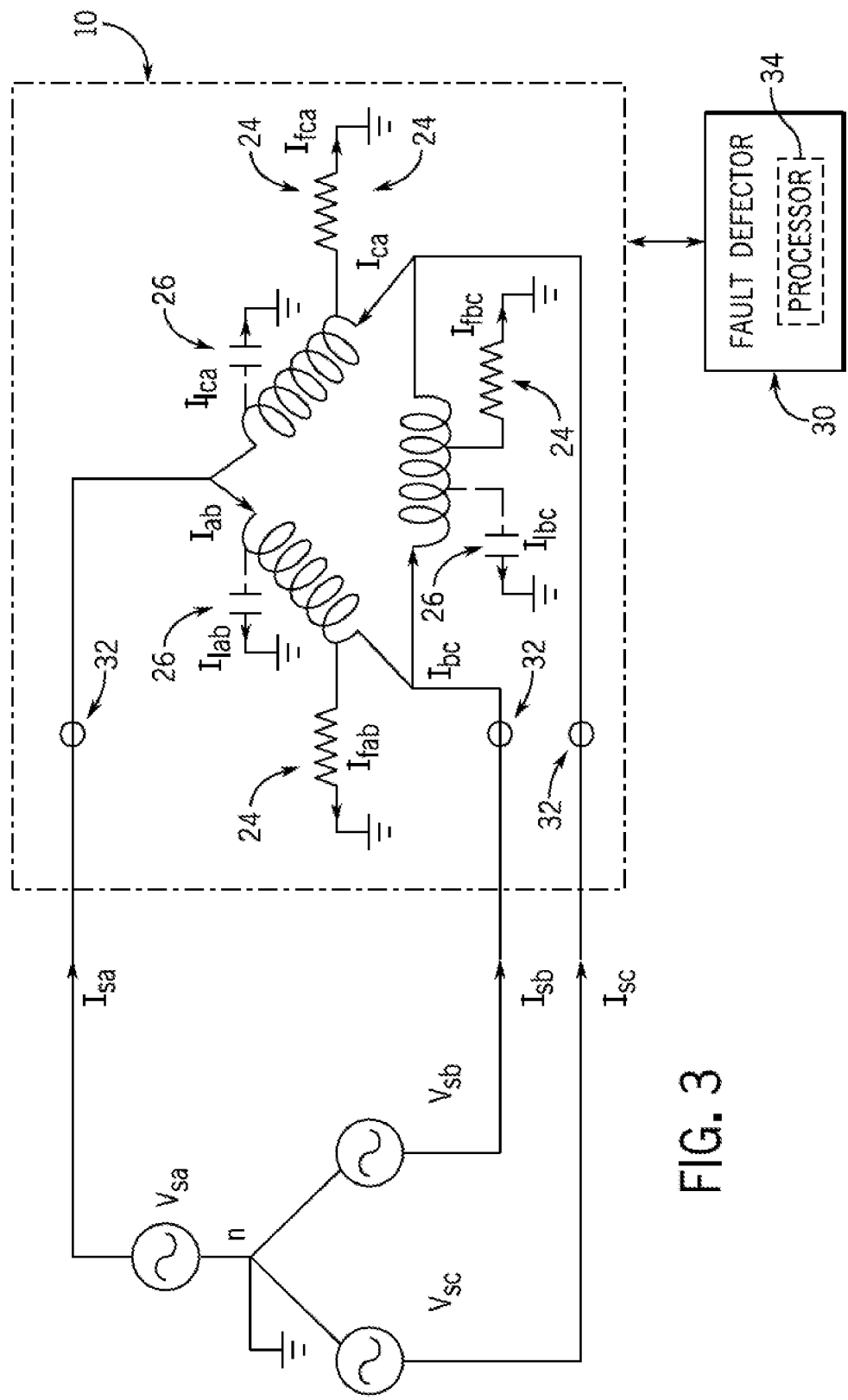
FIG. 3 is a schematic diagram of a delta connected AC electrical machine and associated fault detector for detecting phase-to-ground faults therein, according to an embodiment of the invention.

Referring now to FIGS. 2 and 3, and with continued reference to FIG. 1, equivalent circuit diagrams of an AC electrical machine 10, illustrating current and voltage inputs to the electrical machine as well as capacitance and resistance values of the of the winding insulation 22 provided on the stator windings 20 of the AC electrical machine 10, are illustrated. FIG. 2 illustrates a star connected machine circuit, while FIG. 3 illustrates a delta connected machine circuit. In the star connected circuit of FIG. 2, the supply voltages $V_{sa}$, $V_{sb}$, $V_{sc}$ and the phase currents $I_{sa}$, $I_{sb}$, $I_{sc}$ provided to the AC electrical machine 10 are illustrated, as are the resistance 24 and capacitance 26 of the winding insulation 22 provided on the stator windings 20 of the AC electrical machine 10, with phase-to-ground currents $I_{fa}$, $I_{fb}$, $I_{fb}$ and leakage currents $I_{la}$, $I_{lb}$, $I_{lc}$ also being shown. In the delta connected circuit of FIG. 3, the supply voltages $V_{sa}$, $V_{sb}$, $V_{sc}$ and the phase currents $I_{sa}$, $I_{sb}$, $I_{sc}$ provided to the AC electrical machine 10 are illustrated, as are the resistance 24 and capacitance 26 of the winding insulation 22 provided on the stator windings 20 of the AC electrical machine 10, with phase-to-ground currents $I_{fab}$, $I_{fbc}$, $I_{fca}$ and leakage currents $I_{lab}$, $I_{lbc}$, $I_{lca}$ also being shown.

In order to provide for detection of phase-to-ground faults in the AC electrical machine 10, a fault detector 30 is provided, according to an embodiment of the invention. The fault detector 30 receives inputs regarding the three-phase voltage and current provided to the AC electrical machine 10, such as might be measured by voltage and current sensors 32, for example. As shown in FIGS. 2 and 3, a processor 34 in the fault detector 30 receives the measured three-phase voltages and currents and is programmed to determine zero sequence components and/or negative sequence components of the voltage and current in order to identify a phase-to-ground current in the machine, with the processor 34 performing a compensation for noise-based factors, so as to isolate the phase-to-ground current and thereby improve the detection accuracy of a phase-to-ground fault. The fault detector 30 calculates a fault severity index (FSI) having a magnitude that is an indicator of whether a stator fault is present in the electrical machine.

While the fault detector 30 is shown in FIGS. 2 and 3 as being in the form of a standalone controller/device, it is recognized that such a detector could be incorporated into a protection and control component operably connected to the AC electrical machine 10. That is, a processor 34 having a program/algorithm thereon that enables detection of stator faults in the AC electrical machine 10 can reside in an existing motor starter, motor drive, or other motor control product. The fault detector 30 can thus provide monitoring of the AC electrical machine 10 from a location of the machine or at a location remote from the machine. Furthermore, while embodiments of the invention are described here below with respect to the processor 34 of fault detector 30 being programmed to perform a technique to identify a phase-to-ground fault for the AC electrical machine 10, it is recognized that the term "processor" as used herein need not be a programmable device. That is, it is to be understood that the processor 34 (and the steps performed thereby), as described hereafter, also covers equivalent hardware and computing devices that perform the same tasks.

Examples of the processor 34 determining zero sequence components and/or negative sequence components for both star connected and delta connected windings in the AC electrical machine 10 are set forth in detail here below for purposes of better describing embodiments of the invention.

In one embodiment, the fault detector 30 analyzes zero sequence components for star connected windings 20 (FIG. 2) in the AC electrical machine 10. Upon receiving three-phase voltages $V_{sa}$, $V_{sb}$, $V_{sc}$ and currents $I_{sa}$, $I_{sb}$, $I_{sc}$, the fault detector 30 applies Kirchoff's to the current readings to determine fault, leakage and phase currents for each phase, with the current for each phase being represented by:

$$I_{sa}=I_{la}+I_{fa}+I_a$$

$$I_{sb}=I_{lb}+I_{fb}+I_b$$

$$I_{sc}=I_{lc}+I_{fc}+I_c \quad \text{[Eqn. 1]},$$

where $I_{la}$, $I_{lb}$, $I_{lc}$ are leakage currents, $I_{fa}$, $I_{fb}$, $I_{fc}$ are fault currents, and $I_a$, $I_b$, $I_c$ are phase currents.

Applying a sequence transformation to [Equation 1] can be written as:

$$T*\begin{bmatrix}I_{sa}\\I_{sb}\\I_{sc}\end{bmatrix} = T*\begin{bmatrix}I_{la}\\I_{lb}\\I_{lc}\end{bmatrix} + T*\begin{bmatrix}I_{fa}\\I_{fb}\\I_{fc}\end{bmatrix} + T*\begin{bmatrix}I_a\\I_b\\I_c\end{bmatrix}, \quad \text{[Eqn. 2]}$$

where T is:

$$T = \frac{1}{3}\begin{bmatrix}1 & 1 & 1\\1 & a & a^2\\1 & a^2 & a\end{bmatrix}, \quad \text{[Eqn. 3]}$$

with a being defined as:

$$a = 1\angle 120 = -0.5 + j\frac{\sqrt{3}}{2}. \quad \text{[Eqn. 4]}$$

Substitution of a into [Eqn. 2] thus results in:

$$\frac{1}{3}*\begin{bmatrix}I_{sa}+I_{sb}+I_{sc}\\I_{sa}+a*I_{sb}+a^2*I_{sc}\\I_{sa}+a^2*I_{sb}+a*I_{sc}\end{bmatrix} = \frac{1}{3}*\begin{bmatrix}I_{la}+I_{lb}+I_{lc}\\I_{la}+a*I_{lb}+a^2*I_{lc}\\I_{la}+a^2*I_{lb}+a*I_{lc}\end{bmatrix} + $$
$$\frac{1}{3}*\begin{bmatrix}I_{fa}+I_{fb}+I_{fc}\\I_{fa}+a*I_{fb}+a^2*I_{fc}\\I_{fa}+a^2*I_{fb}+a*I_{fc}\end{bmatrix} + \frac{1}{3}*\begin{bmatrix}I_a+I_b+I_c\\I_a+a*I_b+a^2*I_c\\I_a+a^2*I_b+a*I_c\end{bmatrix}. \quad \text{[Eqn. 5]}$$

Considering that the top line of [Eqn. 2] and [Eqn. 5] corresponds to the zero sequence currents, the total zero sequence line current, $I_{s0}$, can be defined as:

$$I_{s0} = \frac{1}{3}(I_{sa}+I_{sb}+I_{sc}) =$$
$$\frac{1}{3}(I_{la}+I_{lb}+I_{lc}) + \frac{1}{3}(I_{fa}+I_{fb}+I_{fc}) + \frac{1}{3}(I_a+I_b+I_c). \quad \text{[Eqn. 6]}$$

With it being recognized that a sum of the phase components $I_a$, $I_b$, $I_c$ is equal to zero, the total zero sequence line current, $I_{s0}$, can be rewritten as:

$$I_{s0} = \frac{1}{3}((I_{la}+I_{lb}+I_{lc}) + (I_{fa}+I_{fb}+I_{fc})). \quad \text{[Eqn. 7]}$$

Reordering of [Eqn. 7] provides for determination of a zero sequence phase-to-ground current, $I_{0PG}$,—otherwise termed as a Fault Severity Index (FSI) value—that can be analyzed to determine the presence of a phase-to-ground fault. That is, [Eqn. 7] can be rewritten to define a FSI according to:

$$FSI = I_{0PG} = 3*(I_{s0}-I_{l0}) = I_{fa}+I_{fb}+I_{fc} \quad \text{[Eqn. 8]},$$

where $I_{l0}$ is a zero sequence leakage current. The zero sequence leakage current can be defined as a noise-contributed zero sequence current resulting from various noise factors, including supply unbalance, supply voltage variation, unbalanced load, and harmonic currents, for example. The zero sequence leakage current, $I_{l0}$, is defined according to:

$$I_{l0}=Y_0*V_{g0}+k*I_1 \quad \text{[Eqn. 9]},$$

where $V_{g0}$ is a zero sequence component of phase-to-ground or phase-to-neutral voltage, $I_1$ is a positive sequence current, and $Y_0$ and k are constants calibrated to the AC electrical machine 10 upon initialization of a phase-to-ground fault detection algorithm.

Thus, with knowledge of the total zero sequence line current, $I_{s0}$, and the zero sequence leakage current, $I_{l0}$, that results from various noise factors attributed to power supply and load related parameters, a residual or compensated zero sequence current resulting solely from phase-to-ground current, $I_{0PG}$, can be isolated. The residual/compensated zero sequence ground fault current can be described as a FSI value that is then analyzed to determine the presence of a phase-to-ground fault in the AC electrical machine 10. According to an exemplary embodiment, the fault detector 30 functions to compare the calculated FSI to a FSI threshold value and, if the calculated FSI is greater than the FSI threshold value, then indicate that a stator fault is present in the AC electrical machine 10. It is recognized that the FSI threshold value can be set dependent on the severity at which an alarm is to be raised, and thus the threshold could be a pre-defined value in the program or could be determined from user settings or using user inputs. As an example, the FSI threshold value may be set at 7.5 mAmps—such that phase-to-ground currents of greater than 7.5 mAmps are categorized as a stator fault—although it is recognized that the threshold could be a higher or lower value.

In another embodiment, the fault detector 30 analyzes zero sequence components for delta connected windings 20 in the AC electrical machine 10. Upon receiving three-phase voltages $V_{sa}$, $V_{sb}$, $V_{sc}$ and currents $I_{sa}$, $I_{sb}$, $I_{sc}$, the fault detector 30 applies Kirchoff's to the current readings to determine fault, leakage and phase currents for each phase, with the current for each phase being represented by:

$$I_{sa}=I_{ab}-I_{ca}+I_{fca}+I_{lca}$$

$$I_{sb}=I_{bc}-I_{ab}+I_{fab}+I_{lab}$$

$$I_{sc}=I_{ca}-I_{bc}+I_{fbc}+I_{lbc} \quad \text{[Eqn. 10]},$$

where $I_{lca}$, $I_{lab}$, $I_{lbc}$ are leakage currents, $I_{fca}$, $I_{fab}$, $I_{fbc}$ are fault currents, and $I_{ca}$, $I_{bc}$, $I_{ca}$ are phase-to-phase currents.

Applying a sequence transformation to [Eqn. 10] can be written as:

$$T*\begin{bmatrix}I_{sa}\\I_{sb}\\I_{sc}\end{bmatrix} = T*\begin{bmatrix}I_{ab}-I_{ca}\\I_{bc}-I_{ab}\\I_{ca}-I_{bc}\end{bmatrix} + T*\begin{bmatrix}I_{fca}\\I_{fab}\\I_{fbc}\end{bmatrix} + T*\begin{bmatrix}I_{lca}\\I_{lab}\\I_{lbc}\end{bmatrix}, \quad \text{[Eqn. 11]}$$

where T is:

$$T = \frac{1}{3}\begin{bmatrix}1 & 1 & 1\\1 & a & a^2\\1 & a^2 & a\end{bmatrix}, \quad \text{[Eqn. 12]}$$

with a being defined as:

$$a = 1\angle 120 = -0.5 + j\frac{\sqrt{3}}{2}. \qquad \text{[Eqn. 13]}$$

Considering that the top line of [Eqn. 11] corresponds to the zero sequence currents, and with it being recognized that a sum of the phase components $I_{ab}$, $I_{bc}$, $I_{ca}$ is equal to zero, the total zero sequence line current, $I_{s0}$, can be defined as:

$$I_{s0} = \frac{1}{3}((I_{fca} + I_{fab} + I_{fbc}) + (I_{lca} + I_{lab} + I_{lbc})). \qquad \text{[Eqn. 14]}$$

Reordering of [Eqn. 14] provides for determination of an FSI value (i.e., zero sequence phase-to-ground current, $I_{0PG}$) that can be utilized to determine the presence of a phase-to-ground fault. That is, [Eqn. 14] can be rewritten to define a FSI according to:

$$FSI = I_{0PG} = 3*(I_{s0} - I_{l0}) = I_{fca} + I_{fab} + I_{fbc} \qquad \text{[Eqn. 15]},$$

where $I_{l0}$ is a zero sequence leakage current. The zero sequence leakage current can be defined as a noise-contributed zero sequence current resulting from various noise factors, including supply unbalance, supply voltage variation, unbalanced load, and harmonic currents, for example. The zero sequence leakage current, $I_{l0}$, is defined according to:

$$I_{l0} = Y_0 * V_{g0} + k * I_1 \qquad \text{[Eqn. 16]},$$

where $V_{g0}$ is a zero sequence component of phase-to-ground or phase-to-neutral voltage, $I_1$ is a positive sequence current, and $Y_0$ and k are constants calibrated to the AC electrical machine 10 upon initialization of a phase-to-ground fault detection algorithm.

As set forth above, with knowledge of the total zero sequence line current, $I_{s0}$, and the zero sequence leakage current, ho, that results from various noise factors attributed to power supply and load related parameters, a residual or compensated zero sequence current resulting solely from phase-to-ground current, $I_{0PG}$, or FSI value can be isolated that is then analyzed to determine the presence of a phase-to-ground fault in the AC electrical machine 10.

In another embodiment, the fault detector 30 analyzes negative sequence components for star connected windings 20 in the AC electrical machine 10. Upon receiving three-phase voltages $V_{sa}$, $V_{sb}$, $V_{sc}$ and currents $I_{sa}$, $I_{sb}$, $I_{sc}$, the fault detector 30 applies Kirchoff's to the current readings to determine fault, leakage and phase currents for each phase, with the current for each phase being represented by:

$$I_{sa} = I_{la} + I_{fa} + I_a$$

$$I_{sb} = I_{lb} + I_{fb} + I_b$$

$$I_{sc} = I_{lc} + I_{fc} + I_c \qquad \text{[Eqn. 17]},$$

where $I_{la}$, $I_{lb}$, $I_{lc}$ are leakage currents, $I_{fa}$, $I_{fb}$, $I_{fc}$ are fault currents, and $I_a$, $I_b$, $I_c$ are phase currents.

Applying a sequence transformation to [Equation 1] can be written as:

$$T * \begin{bmatrix} I_{sa} \\ I_{sb} \\ I_{sc} \end{bmatrix} = T * \begin{bmatrix} I_{la} \\ I_{lb} \\ I_{lc} \end{bmatrix} + T * \begin{bmatrix} I_{fa} \\ I_{fb} \\ I_{fc} \end{bmatrix} + T * \begin{bmatrix} I_a \\ I_b \\ I_c \end{bmatrix}, \qquad \text{[Eqn. 18]}$$

where T is $$T = \frac{1}{3}\begin{bmatrix} 1 & 1 & 1 \\ 1 & a & a^2 \\ 1 & a^2 & a \end{bmatrix}, \qquad \text{[Eqn. 19]}$$

with a being defined as:

$$a = 1\angle 120 = -0.5 + j\frac{\sqrt{3}}{2}. \qquad \text{[Eqn. 20]}$$

Considering that the bottom line of [Eqn. 18] corresponds to the negative sequence currents, the total negative sequence line current, $I_{s2}$, can be defined as:

$$I_{s2} = \qquad \text{[Eqn. 21]}$$
$$\frac{1}{3}((I_{la} + a^2 I_{lb} + a I_{lc}) + (I_{fa} + a^2 I_{fb} + a I_{fc}) + (I_a + a^2 I_b + a I_c)).$$

Reordering of [Eqn. 21] provides for determination of a FSI value (i.e., negative sequence phase-to-ground current, $I_{2PG}$) that can be utilized to determine the presence of a phase-to-ground fault. That is, [Eqn. 21] can be rewritten to define a FSI according to:

$$FSI = I_{2PG} = 3*(I_{s2} - I_{m2}) = I_{fa} + a^2 I_{fb} + a I_{fc} \qquad \text{[Eqn. 22]},$$

where $I_{m2}$ is a negative sequence leakage current that can be defined as a noise-contributed negative sequence current resulting from various noise factors, including supply unbalance, supply voltage variation, unbalanced load, and harmonic currents, for example.

The negative sequence leakage current, $I_{m2}$, is defined according to:

$$I_{m2} = k_1 * V_1 + k_2 * I_1 + k_3 * V_2 \qquad \text{[Eqn. 23]},$$

where $V_1$ is a positive sequence voltage, $I_1$ is a positive sequence current, $I_2$ is a negative sequence voltage, and $k_1$, $k_2$, $k_3$ are constants that relate $V_1$, $I_1$ and $I_2$, respectively, to $I_{m2}$, and that are calibrated to the AC electrical machine 10 upon initialization of a phase-to-ground fault detection algorithm.

Again, with knowledge of the total negative sequence line current, $I_{s2}$, and the negative sequence leakage current, $I_{m2}$, that results from various noise factors attributed to power supply and load related parameters, a residual or compensated negative sequence current resulting solely from phase-to-ground current, $I_{2PG}$, or FSI value can be isolated that is then analyzed to determine the presence of a phase-to-ground fault in the AC electrical machine 10.

In still another embodiment, the fault detector 30 analyzes negative sequence components for delta connected windings 20 in the AC electrical machine 10. Upon receiving three-phase voltages $V_{sa}$, $V_{sb}$, $V_{sc}$ and currents $I_{sa}$, $I_{sb}$, $I_{sc}$, the fault detector 30 applies Kirchoff's to the current readings to determine fault, leakage and phase currents for each phase, with the current for each phase being represented by:

$$I_{sa} = I_{ab} - I_{ca} + I_{fca} + I_{lca}$$

$$I_{sb} = I_{bc} - I_{ab} + I_{fab} + I_{lab}$$

$$I_{sc} = I_{ca} - I_{bc} + I_{fbc} + I_{lbc} \qquad \text{[Eqn. 24]},$$

where $I_{lca}$, $I_{lab}$, $I_{lbc}$ are leakage currents, $I_{fca}$, $I_{fab}$, $I_{fbc}$ are fault currents, and $I_{ca}$, $I_{bc}$, $I_{ca}$ are phase-to-phase currents.

Applying a sequence transformation to [Eqn. 24] can be written as:

$$T * \begin{bmatrix} I_{sa} \\ I_{sb} \\ I_{sc} \end{bmatrix} = T * \begin{bmatrix} I_{ab} - I_{ca} \\ I_{bc} - I_{ab} \\ I_{ca} - I_{bc} \end{bmatrix} + T * \begin{bmatrix} I_{fca} \\ I_{fab} \\ I_{fbc} \end{bmatrix} + T * \begin{bmatrix} I_{lca} \\ I_{lab} \\ I_{lbc} \end{bmatrix}, \quad [\text{Eqn. 25}]$$

where T is:

$$T = \frac{1}{3}\begin{bmatrix} 1 & 1 & 1 \\ 1 & a & a^2 \\ 1 & a^2 & a \end{bmatrix}, \quad [\text{Eqn. 26}]$$

with a being defined as:

$$a = 1\angle 120 = -0.5 + j\frac{\sqrt{3}}{2}. \quad [\text{Eqn. 27}]$$

Considering that the bottom line of [Eqn. 25] corresponds to the negative sequence currents, the total negative sequence line current, $I_{s2}$, can be defined as:

$$I_{s2} = \frac{1}{3}\big((I_{lca} + a^2 I_{lab} + a I_{lbc}) + \\ (I_{fca} + a^2 I_{fab} + a I_{fbc}) + (I_{ca} + a^2 I_{ab} + a I_{bc})\big). \quad [\text{Eqn. 28}]$$

Reordering of [Eqn. 28] provides for determination of an FSI value (i.e., negative sequence phase-to-ground current, $I_{2PG}$) that can be utilized to determine the presence of a phase-to-ground fault. That is, [Eqn. 28] can be rewritten to define a FSI according to:

$$FSI = I_{2PG} = 3*(I_{s2} - I_{m2}) = I_{fca} + a^2 I_{fab} + a I_{fbc} \quad [\text{Eqn. 29}],$$

where $I_{m2}$ is a negative sequence leakage current. The negative sequence leakage current can be defined as a noise-contributed negative sequence current resulting from various noise factors, including supply unbalance, supply voltage variation, unbalanced load, and harmonic currents, for example. The negative sequence leakage current, $I_{m2}$, is defined according to:

$$I_{m2} = k_1 * V_1 + k_2 * I_1 + k_3 * I_2 \quad [\text{Eqn. 30}],$$

where $V_1$ is a positive sequence voltage, $I_1$ is a positive sequence current, $I_2$ is a negative sequence voltage, and $k_1$, $k_2$, $k_3$ are constants that relate $V_1$, $I_1$ and $I_2$, respectively, to $I_{m2}$, and that are calibrated to the AC electrical machine 10 upon initialization of a phase-to-ground fault detection algorithm.

Again, with knowledge of the total negative sequence line current, $I_{s2}$, and the negative sequence leakage current, $I_{m2}$, that results from various noise factors attributed to power supply and load related parameters, a residual or compensated negative sequence current resulting solely from phase-to-ground current, $I_{2PG}$, or FSI value can be isolated that is then analyzed to determine the presence of a phase-to-ground fault in the AC electrical machine 10.

Figure 4:
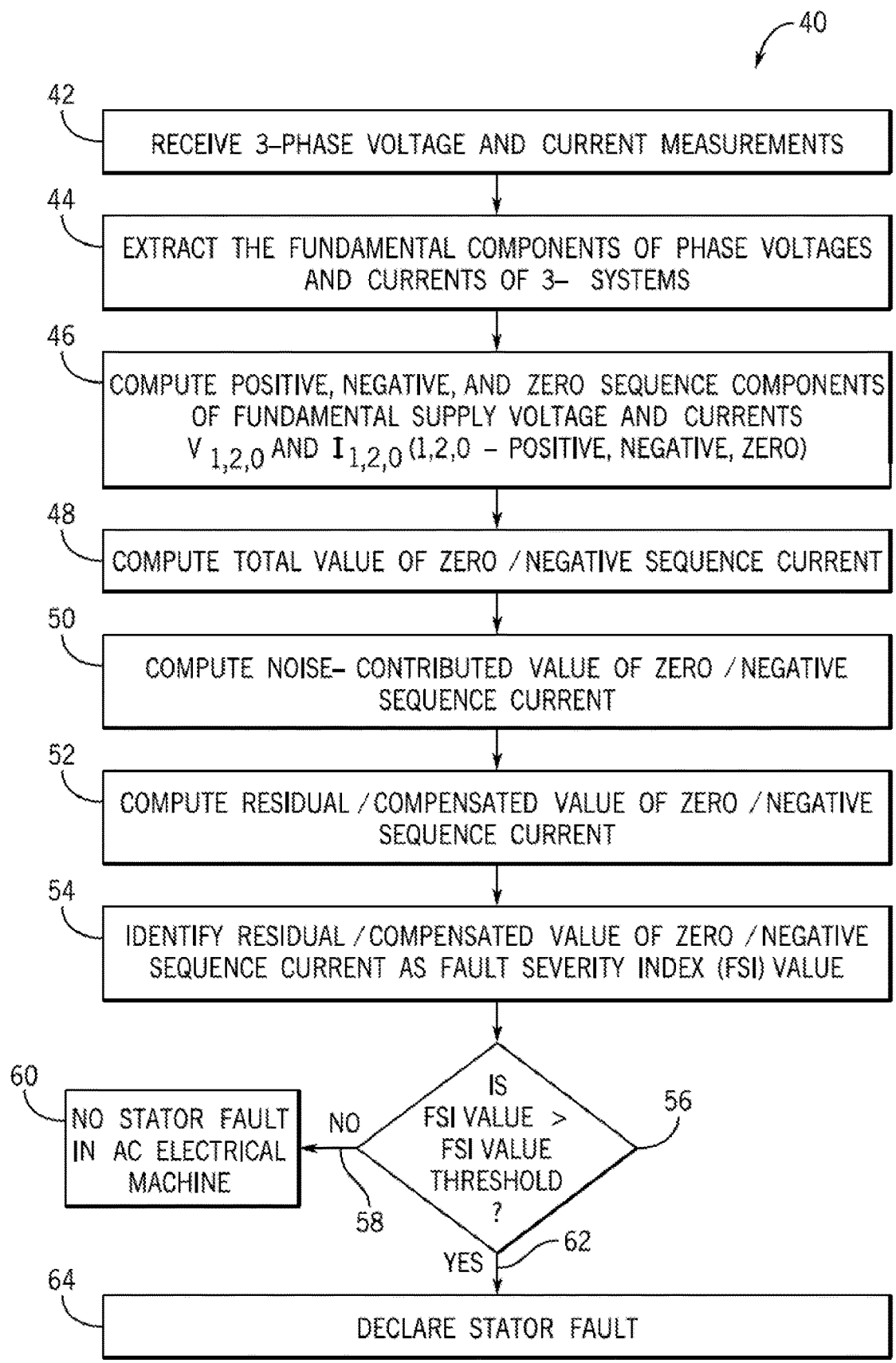
FIG. 4 is flowchart illustrating sub-steps of STEP 64 in FIG. 3 for localizing of an EVD to one or more phases in a three-phase AC circuit according to an embodiment of the invention.

Referring now to FIG. 4, and with continued reference to FIGS. 1-3, a technique 40 is illustrated that is implemented by the processor 34 of fault detector 30 to identify a stator fault in a delta or star connected AC electrical machine 10, according to an embodiment of the invention. It is recognized that the technique 40 for identifying stator faults includes identical steps for both a delta connected motor and a star connected motor, but that the specific calculations/equations employed in the algorithm may vary based on the connection type.

In a first step of the technique 40, three-phase current and voltage measurements are received by the processor 34 at STEP 42. According to an exemplary embodiment, the processor 34 receives three-phase current and voltage data as measured, for example, by current and voltage sensors 32 at a sensing location in proximity to the terminals of the AC electrical machine 10. In one embodiment, upon receiving the three-phase current and voltage measurements, the processor 34 then extracts the fundamental components of the three-phase currents and voltages at STEP 44 according to a known technique/method. STEP 44 is shown in phantom in FIG. 4 as it is recognized that determination of the fundamental components is optional for performing of the technique 40—as detecting a stator fault in the AC electrical machine 10 can be performed without the fundamental components. However, it is recognized that a more accurate analysis of stator faults is achieved via determination and use of the fundamental components, as is described here below.

As shown in FIG. 4, the technique 40 continues with the computing of sequence components of the three-phase voltages and currents at STEP 46, with the sequence components of the voltages being identified as $V_{1,2,0}$ and the sequence components of the currents being identified as $I_{1,2,0}$, where the positive, negative and zero sequence components are identified by 1, 2, and 0, respectively. With respect to determining the voltage and current sequence components, it is recognized that Kirchoff's Voltage Law (KVL) can be applied to the electrical machine to determine these sequence components.

According to embodiments of the invention, one of a zero sequence current and a negative sequence current is then further analyzed by the processor 34 at STEPS 48-64 in order to identify a phase-to-ground fault in the AC electrical machine 10. In analyzing one of the zero sequence current and the negative sequence current, a total value of the zero/negative sequence current is first determined at STEP 48. A noise-contributed value of the zero/negative sequence current that is included in the total value is then determined at STEP 50, with the noise-contributed value being recognized/defined as zero/negative sequence leakage current resulting from noise factors such as supply unbalance, supply voltage variation, unbalanced load, and harmonic currents, for example. From the total value of the zero/negative sequence current and the noise-contributed value of the zero/negative sequence current determined at STEPS 48 and 50, a residual or compensated zero/negative sequence current can be determined at STEP 52—with the residual/compensated zero/negative sequence current being recognized as an isolated phase-to-ground current that is free of influence from the noise factors mentioned above.

Upon determination of a residual/compensated zero/negative sequence current at STEP 52, the technique continues at STEP 54, where the residual/compensated sequence current is identified as a FSI value. The FSI value may then be compared to a FSI threshold value at STEP 56 in order to determine if the magnitude of phase-to-ground current in the AC electrical machine 10 is greater than a threshold current level, so as to enable a determination as to whether the isolated zero/negative sequence current is indicative of a stator fault in the AC electrical machine 10. It is recognized that the threshold current level can be set dependent on the severity at which an alarm is to be raised, and thus the threshold could be a pre-defined value in the program or could be determined from user settings or using user inputs. According to an exemplary embodiment, the current threshold is set at 7.5 m Amps—such that current values greater than 7.5 m Amps are categorized as a stator fault—although it is recognized that the threshold could be a higher or lower value. If it is determined at STEP 56 that the FSI value is less than the threshold FSI value, as indicated at 58, then it is determined that there is no stator fault in the AC electrical machine 10, as indicated at STEP 60. The technique then loops back to STEP 42 with the receiving of additional three-phase current and voltage measurements by the processor 34, such that monitoring for a stator fault is continued. Conversely, if it is determined at STEP 56 that the magnitude of the FSI value is greater than the threshold FSI value, as indicated at 62, then the technique 50 continues as STEP 64 with the identification of a phase-to-ground fault in the AC electrical machine 10 indicative of a stator fault in the machine.

Figure 5:
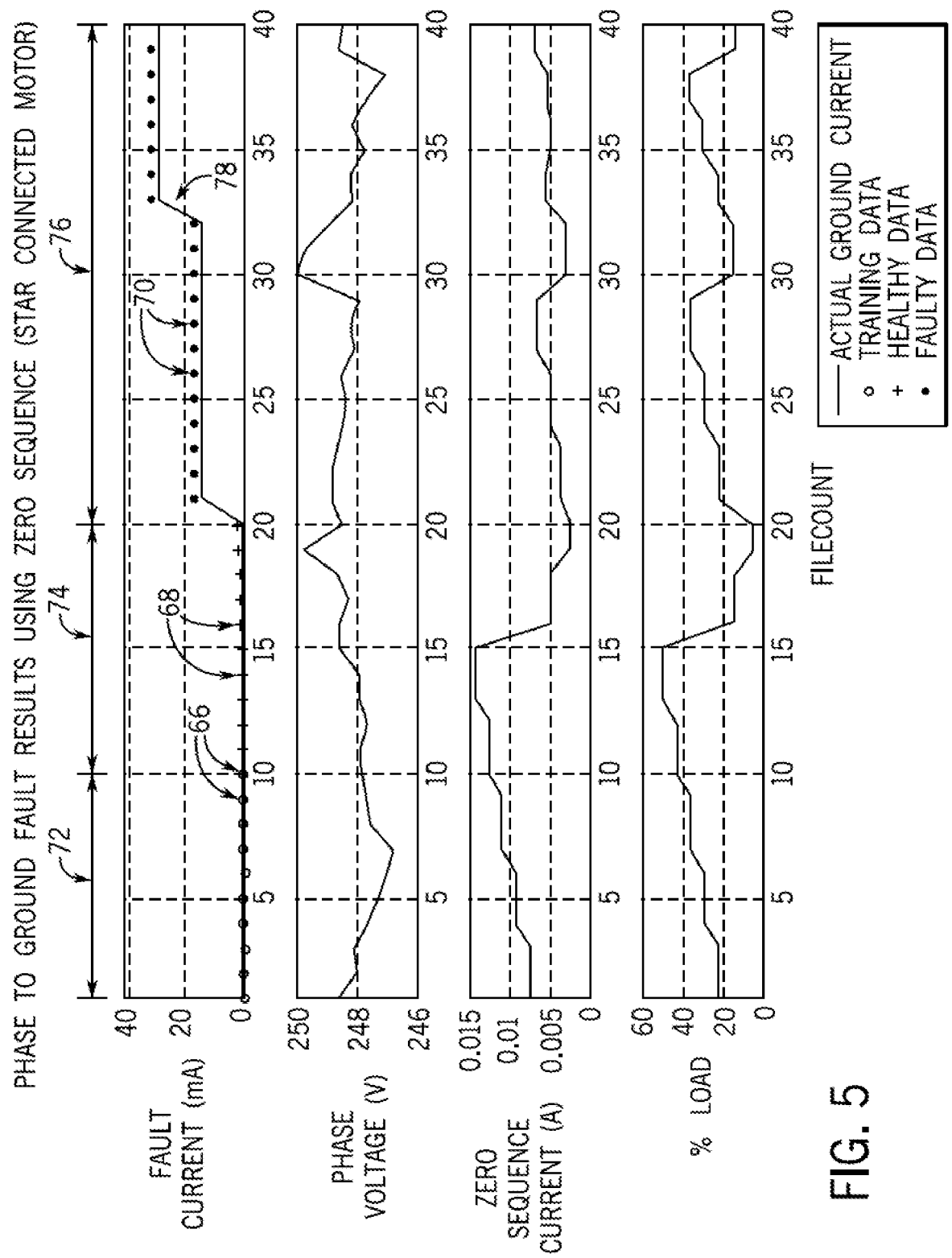
FIG. 5 is a graph illustrating phase-to-ground fault detection using zero sequence components in a star connected AC electrical machine.

Referring now to FIG. 5, a graph is provided illustrating detection of a phase-to-ground fault via analysis on sequence components of the line currents provided to the AC electrical machine 10. While FIG. 5 specifically illustrates a phase-to-ground fault detection for zero sequence components in a star connected machine, it is recognized that similar results could be illustrated with use of zero sequence components in a delta connected machine and with use of negative sequence components in a star or delta connected machine. As shown in FIG. 5, phase-to-ground current is identified separately as training data 66, healthy data 68 and faulty data 70 over different periods of operation. The training data 66 obtained during period 72 (i.e., a start-up of the motor/initialization of the stator fault detection algorithm) may be using to set the value of motor constants used in the stator fault detection algorithm programmed on processor 34—such as $Y_0$ and k [Eqns. 9 and 16] and $k_1, k_2, k_3$ [Eqn. 23]. The healthy data 68 obtained during period 74 is illustrative of phase-to-ground current values (and corresponding FSI values) that do not exceed a designated fault current threshold—such that it is determined that the AC electrical machine 10 is still in a healthy state with no stator fault being present. The faulty data 70 obtained during period 76 is illustrative of phase-to-ground current values (and corresponding FSI values) that exceed a designated fault current threshold—such that it is determined that a stator fault is present in the AC electrical machine 10.

As can be seen in FIG. 5, the phase-to-ground fault current values 70 calculated via analysis of zero/negative sequence components are accurate—as they mirror current measurements made by a dedicated current transformer (indicated by line 78) used for purposes of comparison. Thus, it is seen that embodiments of the invention provide a system and method that achieve reliable detection of a ground fault without the use of a dedicated ground fault CT.

Beneficially, embodiments of the invention thus provide a system and method for detecting stator faults in an electrical machine by using the three-phase voltages and currents provided to the electrical machine. Phase-to-ground currents are determined without the use of a dedicated ground fault CT and in a manner that eliminates the effects of system leakage currents, high-resistance grounding, and/or supply harmonics, that might make it difficult to achieve reliable detection of a ground fault.

A technical contribution for the disclosed method and apparatus is that it provides for a processor-implemented technique for detecting stator faults in three-phase AC motor circuits.

Therefore, according to one embodiment of the present invention, a controller configured to detect a phase-to-ground fault in an AC electrical machine is provided. The controller comprises a processor programmed to receive measurements of three-phase voltages and currents provided to the AC electrical machine, the measurements being received from voltage and current sensors associated with the electrical distribution circuit. The processor is also programmed to compute at least one of a zero sequence component and a negative sequence component of voltage and current from the three-phase voltages and currents and calculate a fault severity index (FSI) based on the at least one of the zero sequence component and the negative sequence component of voltage and current, so as to identify a phase-to-ground fault in the AC electrical machine, wherein calculating the FSI further includes determining a total value of at least one of a zero sequence current and a negative sequence current, determining a noise-contributed value of the at least one of the zero sequence current and the negative sequence current included in the total value, determining a compensated value of the at least one of the zero sequence current and the negative sequence current based on the total value and the noise-contributed value, and calculating the FSI based on the compensated value.

According to another embodiment of the present invention, a method for identifying a phase-to-ground fault in an AC electrical machine includes measuring three-phase voltages and currents provided to the AC electrical machine by way of voltage and current sensors, the AC electrical machine comprising a plurality of stator windings. The method also includes causing a fault detector to identify a phase-to-ground fault in the AC electrical machine, wherein causing the fault detector to identify the phase-to-ground fault comprises receiving the measured three-phase voltages and currents provided to the AC electrical machine, determining one or more of a zero sequence current and a negative sequence current from the three-phase currents, performing a noise-based compensation of the one or more of the zero sequence current and the negative sequence current to produce one or more of a residual zero sequence current and residual negative sequence current representative of a phase-to-ground current, and identifying a phase-to-ground fault in the AC electrical machine based on the one or more of the residual zero sequence current and the residual negative sequence current.

According to yet another embodiment of the present invention, a fault detector for detecting a phase-to-ground fault in an AC electrical machine is provided. The fault detector comprises a processor programmed to receive an input comprising three-phase voltages and currents provided to the AC electrical machine, determine one or more of a zero sequence current and a negative sequence current from the three-phase currents, perform a noise-based compensation of the one or more of the zero sequence current and the negative sequence current to produce one or more of a residual zero sequence current and residual negative sequence current representative of a phase-to-ground current, and identify a phase-to-ground fault in the AC electrical machine based on the one or more of the residual zero sequence current and the residual negative sequence current.

The present invention has been described in terms of the preferred embodiment, and it is recognized that equivalents, alternatives, and modifications, aside from those expressly stated, are possible and within the scope of the appending claims.

What is claimed is:

1. An apparatus comprising:
a controller comprising a processor, wherein the controller is configured to:
access electrical data, the electrical data comprising measurements of three-phase voltages and currents provided to an alternating current (AC) electrical machine;
determine a line current metric based on the electrical data, the line current metric comprising one or more of a total value of a negative sequence line current and a total value of a zero sequence line current;
determine a leakage current metric, the leakage current metric comprising one or more of a zero sequence leakage current value and a negative sequence leakage current value;
determine a compensated metric based on the line current metric and the leakage current metric;
calculate a fault severity index (FSI) based on the compensated metric; and
determine whether a fault exists in the AC electrical machine based on the FSI.

2. The apparatus of claim 1, wherein the controller being configured to determine whether a fault exists in the AC electrical machine based on the FSI comprises the controller being configured to determine whether a phase-to-ground fault exists in the AC electrical machine based on the FSI.

3. The apparatus of claim 1, wherein the controller is further configured to extract fundamental components of the electrical data; and wherein the controller is configured to determine the line current metric based on the fundamental components.

4. The apparatus of claim 1, wherein the controller is configured to determine the compensated metric by subtracting the leakage current metric from the line current metric.

5. The apparatus of claim 1, wherein the line current metric is the total value of the zero sequence line current; the leakage current metric is the zero sequence leakage current value; and the compensated metric is based on the total value of the zero sequence line current and the zero sequence leakage current value.

6. The apparatus of claim 1, wherein the line current metric is the total value of the negative sequence line current; the leakage current metric is the negative sequence leakage current value; and the compensated metric is based on the total value of the negative sequence line current and the negative sequence leakage current value.

7. The apparatus of claim 1, wherein the controller is configured to calculate the leakage current metric based on constants calibrated to the AC electrical machine.

8. The apparatus of claim 1, wherein the AC electrical machine is a star-connected electrical machine.

9. The apparatus of claim 1, wherein the AC electrical machine is a delta-connected electrical machine.

10. The apparatus of claim 1, further comprising:
a protection and control component configured to connect to the AC electrical machine, and wherein the controller is coupled to the protection and control component.

11. The apparatus of claim 10, further comprising the AC electrical machine, and wherein the protection and control component and the controller are part of the AC electrical machine.

12. The apparatus of claim 1, wherein, to determine whether a fault exists in the AC electrical machine based on the FSI, the controller is configured to:
compare the FSI to a threshold; and
determine that a fault exists if the FSI exceeds the threshold.

13. A method comprising:
receiving electrical data, the electrical data comprising measurements of three-phase voltages and currents provided to an alternating current (AC) electrical machine;
determining a line current metric based on the electrical data, the line current metric comprising one or more of a total value of a negative sequence line current and a total value of a zero component line current;
determining a leakage current metric, the leakage current metric comprising one or more of a zero sequence leakage current value and a negative sequence leakage current value;
determining a compensated metric based on the line current metric and the leakage current metric;
calculating a fault severity index (FSI) based on the compensated metric; and
determining whether a fault exists in the AC electrical machine based on the FSI.

14. The method of claim 13, further comprising extracting fundamental components of the three-phase voltage and currents from the electrical data; and wherein the line current metric is determined from the fundamental components.

15. The method of claim 13, further comprising: determining positive, negative, and zero sequence components of the three phase voltages and currents based on the electrical data.

16. A fault detector comprising:
a protection and control component configured to communicate with an AC electrical machine; and
a controller coupled to the protection and control component, the controller configured to:
access electrical data, the electrical data comprising one or more of measurements of three-phase current provided to the AC electrical machine and measurements of three-phase voltage provided to the AC electrical machine;
determine a line current from the electrical data, the line current comprising one or more of a total zero sequence line current and a total negative sequence line current;
determine a leakage current metric, the leakage current metric comprising one or more of a zero sequence leakage current value and a negative sequence leakage current value;
determine residual current metric related to a phase-to-ground current based on the leakage current metric and the line current; and
determine whether a fault exists in the AC electrical machine based on the residual current metric.

17. The fault detector of claim 16, wherein the controller being configured to determine whether a fault exists in the AC electrical machine based on the residual current metric comprises the controller being configured to determine whether a phase-to-ground fault exists in the AC electrical machine.

18. The fault detector of claim 17, wherein to determine whether a fault exists in the AC electrical machine, the controller is further configured to:

identify the residual current metric as a fault severity index (FSI);
compare the FSI to a threshold; and
declare that a fault exists if the FSI exceeds the threshold.

19. The fault detector of claim 16, wherein the leakage current metric is based on one or more constant values that are specific to the AC electrical machine.

20. The fault detector of claim 16, wherein the protection and control component is configured to communicate with one or more sensors in the AC electrical machine, the one or more sensors being configured to sense the electrical data and provide it to the protection and control component, and the electrical data comprises measurements of three-phase voltage and three-phase current provided to the AC electrical machine.

* * * * *